United States Patent [19]

Battersby et al.

[11] Patent Number: 5,250,815
[45] Date of Patent: Oct. 5, 1993

[54] HOT ELECTRON INJECTOR GUNN DEVICE WITH ANODE HEAT SINK

[75] Inventors: Stephen J. Battersby, Haywards Heath; Stewart B. Jones, Poynton, both of England

[73] Assignee: U.S. Philips Corp., New York, N.Y.

[21] Appl. No.: 717,225

[22] Filed: Jun. 18, 1991

[30] Foreign Application Priority Data

Jun. 20, 1990 [GB] United Kingdom ............... 9013790

[51] Int. Cl.⁵ .................... H01L 47/02; H01L 23/34
[52] U.S. Cl. ......................... 257/6; 257/498; 257/625
[58] Field of Search ............ 357/3, 13, 81; 257/6, 257/8, 498, 625, 712

[56] References Cited

U.S. PATENT DOCUMENTS 4,189,342  2/1980  Kock .................................. 156/308

FOREIGN PATENT DOCUMENTS 8809057  11/1988  PCT Int'l Appl. .
1228199  4/1971  United Kingdom .
2196473  4/1988  United Kingdom .
2219131  11/1989  United Kingdom .

OTHER PUBLICATIONS

"Advances in Hot Electron Injector Gunn Diodes" H. Spooner et al GEC Journal of Research vol. 7, No. 1, 1989, pp. 34–45.

Sze, Physics of Semiconductor Devices, Chapter 11, pp. 637–678, 2nd Ed. (Wiley, N.Y., 1981).

Primary Examiner—William D. Larkins
Attorney, Agent, or Firm—Steven R. Biren

[57] ABSTRACT

A transferred electron effect device (1) has adjacent its cathode contact region (3) an injection zone (60) defining a potential barrier (P) for causing electrons to be emitted, under the influence of an electric field applied between the cathode and anode contact regions (3 and 4), into the active region (5) of the device with an energy comparable to that of a relatively high mass, low mobility satellite minimum (L) of the active region (5). The anode contact region (4), active region (5), injection zone (60) and cathode contact region (3) are grown sequentially, for example using molecular beam epitaxy, on a substrate which is then selectively removed to expose the anode contact region. A heat sink (70) is provided in thermal contact with the anode contact region (4). Providing the heat sink (70) in thermal contact with the anode contact region (4) rather than the cathode contact region (3) enables a significant increase in rf output power.

6 Claims, 4 Drawing Sheets

HOT ELECTRON INJECTOR GUNN DEVICE WITH ANODE HEAT SINK

BACKGROUND OF THE INVENTION

This invention relates to a transferred electron effect device and to a method of manufacturing such a device.

A Paper entitled 'Advances in hot electron injector Gunn diodes' by H. Spooner and N. R. Coach Published in the GEC Journal of Research Vol. 7, No.1, 1989 at pages 34 to 45 describes a transferred electron effect device comprising a semiconductor body having cathode and anode contact regions, an active region of n conductivity type disposed between the contact regions and formed of a semiconductor material having a relatively low mass, high mobility conduction band main minimum and at least one relatively high mass, low mobility conduction band satellite minimum, and an injection zone adjoining the active region and defining a potential barrier between the cathode contact region and the active region for causing electrons to be emitted, under the influence of an electric field applied between the cathode and anode contact regions, from the injection zone into the active region with an energy comparable to that of a relatively high mass, low mobility conduction band satellite minimum of the active region.

As described in the aforementioned paper, and as discussed in detail in Chapter II pages 637 to 767 of the text book 'Physics of Semiconductor Devices', Second Edition by S. M. Sze Published in 1981 by John Wiley & Sons Inc. of New York, certain semiconductor materials such as gallium arsenide or indium phosphide exhibit a bulk negative differential resistance when an electric field above a threshold or critical field is applied across a sample of the material, allowing charge instabilities to grow to form accumulation or dipole layers. semiconductor materials exhibiting such a bulk negative differential resistance can, as first observed by Gunn, be used to form devices which generate a coherent microwave output when a dc electric field greater than the critical field is applied.

In order to enable electrons to be transferred to a relatively high mass, high energy low mobility satellite minimum (L) to obtain the negative differential resistance characteristic, sufficient energy has to be imparted to the electrons by the applied electric field. Conventionally, as discussed in the aforementioned paper, a transferred electron effect device comprises a relatively lowly doped n-conductivity type active region, for example an active region with a dopant concentration of about $1 \times 10^{16}$ atoms cm$^{-3}$, of an appropriate semiconductor material, for example gallium arsenide or indium phosphide, with relatively highly doped n-conductivity type regions being provided at opposed surfaces of the active region to enable ohmic contact to cathode and anode electrodes across which the electric field is to be applied. With such a conventional ohmic contact structure, electrons accelerated by the electric field do not achieve sufficient energy to transfer to a conduction band satellite minimum until they have traversed a given distance along the semiconductor body between the cathode and anode contacts. Thus, in such a conventional ohmic contact structure, the injection zone comprises a part of the active region and forms an acceleration zone in which electrons in the main conduction band minimum are accelerated and heated. Accordingly, the accumulation or dipole layers which result in the microwave oscillation grow some distance from the cathode and there is in effect a dead zone within the device. For a given applied electric field, the length of the acceleration zone is effectively fixed whilst the frequency of the microwave output is inversely proportional to the length of the device. Accordingly as demand occurs for devices capable of providing higher and higher frequency microwave outputs, the proportion of the length of the device taken up by the acceleration zone or dead zone increases adversely affecting device performance and efficiency.

In order to improve the power and efficiency of a transferred electron effect device with a given active region length, the accumulation or dipole layer should start as close to the cathode as possible. Accordingly, as discussed in the aforementioned paper, an injection zone or injecting structure is used to tailor the electric field, current and charge distribution at the cathode end of the active region so that electrons are emitted into the active region as hot electrons, that is electrons not in thermal equilibrium with the lattice, with an energy comparable to that of a relatively high mass, high energy, low mobility conduction band satellite minimum to enable the accumulation layer or dipole to start as close to the cathode as possible.

The aforementioned paper discusses in detail the use of a graded heterojunction injecting structure. That is the use of a region of, in this case of a gallium arsenide transferred electron effect device, an undoped linearly graded $Al_xGa_{1-x}As$ layer where x increases linearly from 0 to 0.3 over 50 nm (nanometers) giving an injection energy for the electrons emitted into the active region of about 250 meV close enough to the energy separating the conduction band main minimum (Γ) and a conduction band satellite minimum (L) for significant electron transfer.

This structure is produced by growing, on a highly n conductivity type doped gallium arsenide substrate, an epitaxial layer structure consisting of a highly n conductivity type buffer layer, then the relatively lowly doped transit or active region. The injecting structure is then grown as a graded bandgap heterojunction layer of $Al_xGa_{1-x}As$ with x decreasing away from the active region so that an abrupt interface is provided at the active region and finally a highly doped cathode contact region is provided on the injecting structure. As described in the paper, a highly doped depletion stop layer may be provided at the abrupt interface with the active region. The graded bandgap heterojunction injecting structure thus provides a potential barrier over which electrons are emitted into the active region with an energy comparable to that of a high mass, high energy, low mobility conduction band satellite minimum (L).

The actual devices or chips are formed from the thus-produced wafer by a standard integral heat sink (IHS) technology using conventional photolithographic and etching techniques which the paper states enables the heat sink region to be placed close to the epitaxial layers where most of the heat is generated, that is at the cathode end of the device.

SUMMARY OF THE INVENTION

It is an aim of the present invention to provide a transferred electron effect device having an injection zone in which improved rf (radio frequency) output power and efficiency may be achieved and to provide a method of manufacturing such a device.

According to one aspect of the present invention, there is provided a transferred electron effect device comprising a semiconductor body having cathode and anode contact regions, an active region of n conductivity type disposed between the contact regions and formed of a semiconductor material having a relatively low mass, high mobility conduction band main minimum and at least one relatively high mass, low mobility conduction band satellite minimum, and an injection zone adjoining the active region and defining a potential barrier between the cathode contact region and the active region for causing electrons to be emitted, under the influence of an electric field applied between the cathode and anode contact regions, from the injection zone into the active region with an energy comparable to that of a relatively high mass, low mobility conduction band satellite minimum of the active region, characterised in that the anode contact region is in thermal contact with a heat sink region for removing heat dissipated within the semiconductor body.

The present inventors have thus found that surprisingly, despite the assertions in the aforementioned paper that the highest electric fields will occur at the cathode injecting structure, the placing of heat sink at the anode end of the device rather than at the cathode end as described in the aforementioned paper enables significant improvements in, especially, rf output power. It is believed by the present inventors that, in complete contrast to the discussion in the aforementioned paper, the provision of the heat sink region adjacent the anode contact region results in a significant increase in rf output power and efficiency because the injection zone acts to eliminate or at least substantially reduce the dead 'acceleration' zone which is present in a conventional ohmic-contact Gunn diode. Thus, because the injection zone is effective in removing or at least reducing the energy dissipating dead zone, the energy or heat dissipation within the transferred electron effect device is weighted even more strongly towards the anode end of the device so enabling greater rf output powers to be achieved when the heat sink region is at the anode end of the device.

The active region and the injection zone are, in a preferred arrangement, formed by an epitaxial layer structure from which the monocrystalline substrate on which the active region and the injection zone were sequentially grown has been selectively removed to expose a surface of the epitaxial layer structure, and the heat sink region contacts the exposed surface of the epitaxial layer structure.

The present invention also provides a method of manufacturing a transferred electron device, which method comprises providing a semiconductor substrate, providing an epitaxial layer structure on the semiconductor substrate to define a semiconductor body having an anode contact region adjacent the substrate, an active region of n conductivity type formed of a semiconductor material having a relatively low mass, high mobility conduction band main minimum and at least one relatively high mass, low mobility conduction band satellite minimum, an injection zone adjoining the active region and a cathode contact region, the injection zone defining a potential barrier between the cathode contact region and the active region for causing electrons to be emitted, under the influence of an electric field applied between the cathode and the anode contact regions, from the injection zone into the active region with an energy comparable to that of a relatively high mass, low mobility satellite minimum of the active region, characterised by, after defining the epitaxial layer structure, selectively removing the substrate to expose a surface of the anode contact region and then providing a heat sink region on the exposed surface of the anode contact region for removing heat dissipated in the epitaxial layer structure.

The use of a method in accordance with the present invention thus enables the anode heat sink to be provided on the surface of the epitaxial layer structure which has been exposed by selective removal of the substrate upon which the epitaxial layer structure was grown. This enables the heat sink region to be in thermal contact with the anode contact region so enabling significantly increased rf output powers to be achieved whilst allowing the epitaxial layer to be grown starting with any buffer layer and sequentially following that the active region, then the injection zone and finally the cathode contact region. This means that the active region is grown before the injection zone. The injection zone thus does not have to suffer the prolonged high temperature environment (would have given rise to increased diffusion and interface degradation) which would have existed if the injection zone were grown before the active region.

The dopant concentration of the active region may be uniform. However, during use of the device a thermal gradient develops across the active region which creates a mobility $\mu_n$ gradient and as the carrier concentration n is essentially constant up to about 250° C. the resistivity $Pn=(q\mu_n n)^{-1})$ of the active region will vary with the mobility. As the mobility is inversely proportional to the temperature, variations in resistivity will be proportional to temperature. The doping profile of the active region can be graded to compensate for the temperature gradient. The use of a method in accordance with the present invention has a further advantage where such graded dopant profile active regions are used in that it enables the dopant concentration within the active region to be increased during the growth of the active region so as to produce the graded profile.

Most epitaxial growth machines, for example MBE (Molecular beam epitaxy) machines produce better, i.e. more abrupt, interfaces when the dopant concentration is increased, rather than decreased, during the growth process to produce the desired graded profile and using a method in accordance with the present invention allows any graded profile active region to be produced by increasing the dopant concentration during growth.

Generally, in a method in accordance with the invention, a sacrificial layer of a semiconductor material different from that of the substrate and of the anode contact region, for example a layer of aluminium gallium arsenide where the substrate and anode contact regions are formed of gallium arsenide, is provided between the substrate and the anode contact region to enable the substrate to be removed by first selectively removing the substrate, for example by wet etching, with respect to the sacrificial layer and then selectively removing the sacrificial layer with respect to the anode contact regions so allowing precise control of the substrate removal.

A sacrificial support may be provided on the cathode contact region prior to removing the substrate so as to provide stability and strength to the epitaxial layer structure after removal of the substrate. The sacrificial support may then be removed after the heat sink has been provided on the exposed surface of the anode contact region. The sacrificial support may be formed of any suitable material. For ease of manufacture, the sacrificial support may be formed in the same way as a conventional heat sink by, for example, plating a suitable metal such as silver onto the cathode contact region.

In one example, the injection zone comprises first and second n conductivity type regions separated by a barrier-defining region which has an impurity concentration characteristic of the p conductivity type and which is sufficiently thin so as to be fully depleted of free charge carriers under zero bias, at least one of the first and second regions being highly doped relative to the active region at least adjacent the barrier-defining region and the barrier-defining region having an impurity concentration such that, in operation of the device, electrons with sufficient energy to surmount the potential barrier provided by the barrier-defining region are emitted into the active region with an energy comparable to that of a conduction band satellite minimum of the active region.

Such an injection zone makes use of a potential barrier which is provided within the bulk of the semiconductor and is not constrained by the effect of Fermi pinning by surface states. Furthermore, the height of the potential barrier defined by the barrier-defining region may be adjusted relatively simply and easily by altering the doping of the barrier-defining region.

The first region may, at least adjacent the barrier-defining region, be more highly doped than the second and active regions and may adjoin the active region. The second region may comprise first and second subsidiary regions and the second subsidiary region may be spaced from the barrier-defining region and be more highly doped than the active region and the first subsidiary region. An injection zone of this type forms a camel diode as described in, for example, GB-A-1573309 and GB-A-1573310 and in a paper entitled "A new majority carrier diode—the camel diode" by J. M. Shannon published in the proceedings of the Eleventh Conference (1979 International) on solid state devices, Tokyo 1979, Japanese Journal of Applied Physics Vol. 19 (1980) Supplement 9-1 at pages 301 to 304. In operation of the device, when the potential difference is applied to enable a field greater than the threshold or critical field to be established in the active region, the camel diode is forward-biassed and the energy of the electron distribution in the relatively lowly doped first subsidiary region is raised, facilitating thermionic emission of electrons over the potential barrier defined by the barrier-defining region. The first region is sufficiently thin that no significant thermalisation of the thermionically emitted electrons occurs and accordingly electrons are emitted over the potential barrier into the active region with an energy comparable to that of a conduction band satellite minimum enabling the active region to exhibit a negative differential resistance and so facilitating use of the device as, for example, a microwave oscillator without the need for a relatively long high field acceleration zone or dead space.

Alternatively, the second region may adjoin the active region and comprise first and second subsidiary regions, the second subsidiary region being spaced from the barrier-defining region by the first subsidiary region, the first region and the second subsidiary region being more highly doped than the first subsidiary region and the active region. The injection zone again forms a camel diode, but in this example the camel diode is reverse-biassed in operation of the device. The reverse-biassing of the camel diode pulls down the potential barrier to some extent, enabling an increased flow of electrons over the potential barrier and, in this case, the camel diode serves to establish a relatively short high field region subsidiary region which further heats or accelerates electrons passing over the potential barrier defined by the barrier region, so enabling electrons with an energy comparable to that of the conduction band satellite minima of the active region to be emitted into the active region, facilitating the exhibition by the active region of a negative differential resistance and so the use of the device as, for example, a microwave oscillator.

BRIEF DESCRIPTION OF THE DRAWING

Embodiments of the invention will now be described, by way of example, with reference to the accompanying drawing, in which.

It should be understood that the figures are merely schematic and are not drawn to scale. In particular the thickness of certain layers or regions has been relatively exaggerated while the thickness of other layers or regions has been relatively reduced in the interests of clarity. It should also be understood that the same reference numerals are used throughout the figures to indicate the same or similar parts.

DESCRIPTION OF THE PREFERRED EMBODIMENTS

Figure 9:
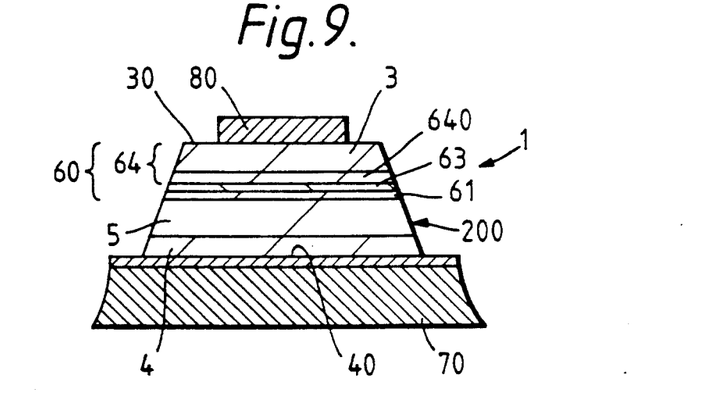
FIG. 9 is a cross-sectional view of a transferred electron effect device manufactured by the method illustrated by FIGS. 1 to 8.
Figure 12:
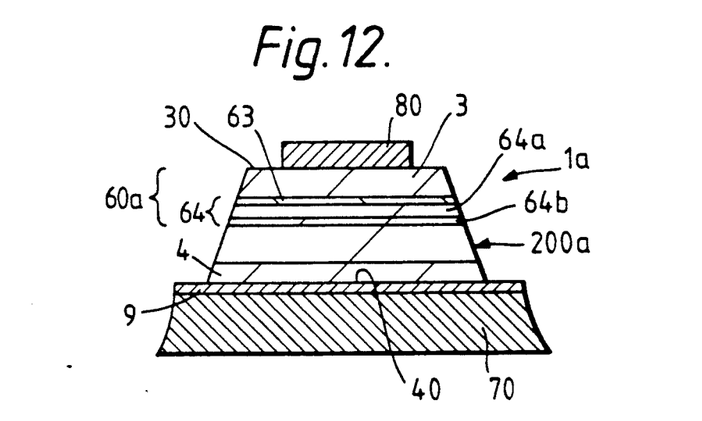
FIG. 12 is a cross-sectional view of the other transferred electron effect device in accordance with the invention manufactured from the epitaxial layer structure shown in FIG. 11.

Referring now to the drawing, for example FIG. 9 or 12, a transferred electron effect device 1,1$a$ comprises a semiconductor body 2,2$a$ having cathode and anode contact regions 3,4 an active region 5 of n conductivity type disposed between the contact regions 3,4 and formed of a semiconductor material having a relatively low mass, high mobility conduction band main minimum ($\Gamma$) and at least one relatively high mass, low mobility conduction band satellite minimum (L), and an injection zone 60,60$a$ adjoining the active region 5 and defining a potential barrier P,P' between the cathode contact region 3 and the active region 5 for causing electrons to be emitted, under the influence of an electric field E applied between the cathode and anode contact regions 3,4, from the injection zone 60,60a into the active region 5 with an energy comparable to that of a relatively high mass, low mobility satellite minimum (L) of the active region 5.

In accordance with the invention, the anode contact region 4 is in thermal contact with a heat sink region 7 for removing heat dissipated within the semiconductor body 2.

FIGS. 1 to 8 illustrate a method of manufacturing such a transferred electron effect device. This method comprises providing a semiconductor substrate 20, providing an epitaxial layer structure on the semiconductor substrate 20 to define the semiconductor body 2 with the anode contact region 4 adjacent the substrate 20 and followed sequentially by the active region 5, the injection zone 60 and the cathode contact region 3.

In accordance with the invention, after defining the epitaxial layer structure, the substrate 20 is selectively removed to expose a surface 40 of the anode contact region 4 and a heat sink region 7 is provided on the exposed surface 40 for removing heat dissipated in the epitaxial layer structure 2.

Generally, a sacrificial layer 21 of a semiconductor material different from that of the substrate 20 and of the anode contact region 4 is provided between the substrate 20 and the anode contact region 4 and, after defining the epitaxial layer structure 2, the substrate 20 is first selectively removed with respect to the sacrificial layer 21 which is then selectively removed with respect to the anode contact region 4 so enabling precise control of the end point of the substrate removal where, as may normally be the case, the substrate 20 and the anode contact region 4 are formed of the same materials or materials which cannot be etched relatively with respect to one another. Of course, if the substrate 20 can be selectively etched with respect to the anode contact region 4 then the sacrificial layer 21 may be omitted.

In order to provide support and strength to the epitaxial layer structure 2 after removal of the substrate 20, a sacrificial support 10 can be provided on the cathode contact region 3 prior to removing the substrate 2. This sacrificial support 10 may then be removed after the heat sink region 7 has been provided on the surface 40 of the anode contact region 4 exposed by removal of the substrate 20. The sacrificial support 10 may be formed of any suitable material. For ease of manufacture, the sacrificial support may be formed in the same way as a conventional heat sink by, for example, plating a suitable metal such as silver onto the cathode contact region 3.

A first embodiment of a transferred electron effect device in accordance with the invention and a method of manufacturing this device will now be described in detail with reference to FIGS. 1 to 9 of the accompanying drawings.

Figure 1:
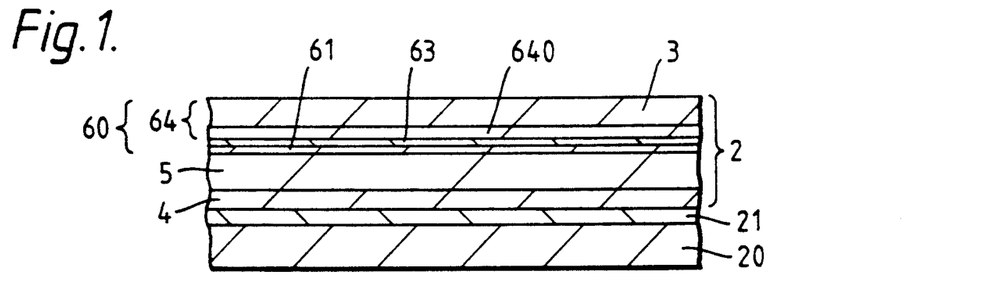
FIG. 1 is a cross-sectional view of an epitaxial layer structure, grown on a substrate, to be used in manufacturing a transferred electron effect device in accordance with the present invention.

Referring firstly to FIG. 1, in this example, the semiconductor substrate 20 is provided as a monocrystalline gallium arsenide substrate which is highly doped with n conductivity type impurities. As mentioned above, a sacrificial layer 21 of a material which is selectively etchable with respect to gallium arsenide, in this example a sacrificial layer 21 of not intentionally doped aluminium gallium arsenide $Al_xGa_{1-x}As$ (where x is typically 0.3) is first grown on the monocrystalline gallium arsenide substrate 20. In this example, the sacrificial layer 21 and succeeding epitaxial layers to be described below are grown using conventional molecular beam epitaxy techniques in a conventional molecular beam epitaxy (MBE) machine such as the Varian Gen II MBE machine manufactured by Varian Associates of Palo Alto Calif. Typically the sacrificial aluminium gallium arsenide layer 21 may have a thickness of about 1 μm (micrometers).

After formation of the sacrificial layer 21, the epitaxial layer structure or semiconductor body 2 is grown in the same MBE machine. Firstly, the anode contact region 4 is grown as an epitaxial layer of gallium arsenide to a thickness of about 1.5 μm. The anode contact region 4 is sufficiently highly doped with n conductivity type impurities to enable ohmic contact to be made to the anode contact region 4. Typically, the anode contact region 4 is doped with silicon atoms to have an impurity concentration of about $5 \times 10^{18}$ atoms cm$^{-3}$.

The active region 5 is provided on the anode contact region 4 as an epitaxial layer of relatively lowly doped n conductivity type gallium arsenide. Typically, where the device is to have a fundamental frequency of about 47 GHz (Gigahertz), the active region 5 may have a thickness of about 2.0 μm nd a dopant concentration of about $1.0 \times 10^{16}$ atoms cm$^{-3}$.

The injection zone 60 is then grown. In this example, the injection zone 60 is provided as a camel diode as described, for example, in GB-A-1573309 and GB-A-1573310 and in a paper entitled "A new majority carrier diode—the camel diode" by J. M. Shannon published in the proceedings of the Eleventh Conference (1979 International) on solid state devices, Tokyo 1979, Japanese Journal of Applied Physics Vol. 19 (1980) Supplement 9-1 at pages 301 to 304.

Thus, in this example, the injection zone 60 is formed by a first region 61 of gallium arsenide highly doped with n conductivity type impurities, again, for example, silicon atoms, and having a thickness of, for example, 10 nm (nanometers) and a dopant concentration of about $5 \times 10^{18}$ atoms Cm$^{-3}$. A region 63 for defining the potential barrier P across which electrons are to be emitted into the active region 5 with an energy comparable to that of the conduction band satellite minimum (L) of gallium arsenide is then grown as a layer of gallium arsenide highly doped with p conductivity type impurities. In this example, the barrier-defining region 63 is doped with beryllium atoms to a dopant concentration of, for example, $3.5 \times 10^{18}$ atoms cm$^{-3}$ and may have a thickness of 16 nm.

After formation of the barrier-defining region 63, a second region 64 of the injection zone 60 is provided. In this example, the second region 64 comprises a first relatively lowly doped n-conductivity subsidiary region 640 having, typically, a dopant concentration of $1.0 \times 10^{16}$ atoms cm$^{-3}$ and a thickness of, in this example, 0.1 μm and a second relatively highly doped subsidiary region which also forms the cathode contact region 3 and may have a dopant concentration of $5 \times 10^{18}$ atoms cm$^{-3}$ and a thickness of 1. 5 μm.

After formation of the cathode contact region 3, the epitaxial growth is completed and the epitaxial structure 2, on its substrate 20, as shown in FIG. 1 is then removed from the MBE machine.

Figure 2:
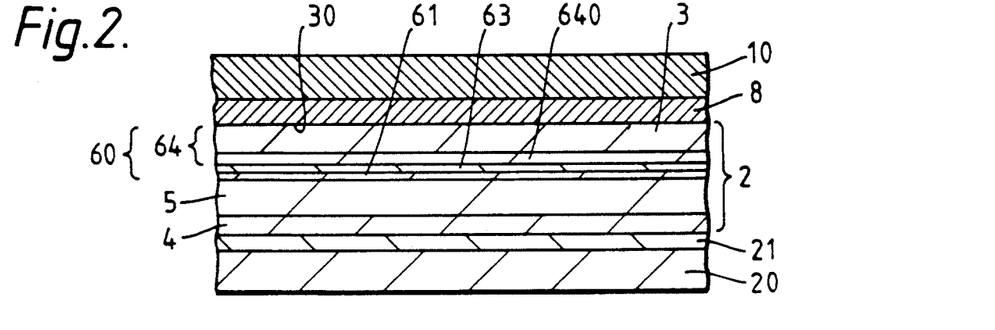
FIGS. 2 to 8 are cross-sectional views, similar to FIG. 1, illustrating various stages in a method in accordance with the invention for manufacturing a transferred electron effect device from the epitaxial layer structure shown in FIG. 1.

After removal of the epitaxial structure 2 carried by the substrate 20 from the MBE machine, an electrically conductive cathode contact layer 8 is provided, as shown in FIG. 2, on the surface 30 of the cathode contact region 3. In this example, the contact layer 8 may be formed by a thin sputtered layer of a gold-germanium eutectic followed by a thin sputtered layer of gold and finally a thicker layer of gold deposited by conventional plating techniques to provide a cathode contact layer 8 having a thickness of somewhat greater than 2 μm.

After deposition of the cathode contact layer 8, the sacrificial support 10 is provided on the cathode contact layer 8. The sacrificial support 10 is for ease of manufacture provided using the materials and techniques available for forming conventional heat sinks. Thus, the sacrificial support 10 is, in this example, formed by depositing for example using a conventional plating technique, about 50 μm of silver onto the gold contact layer 8. Any other materials which can be of sufficient thickness to provide the necessary support and which can later be selectively removed with respect to the cathode contact layer 8 may be used.

Figure 3:
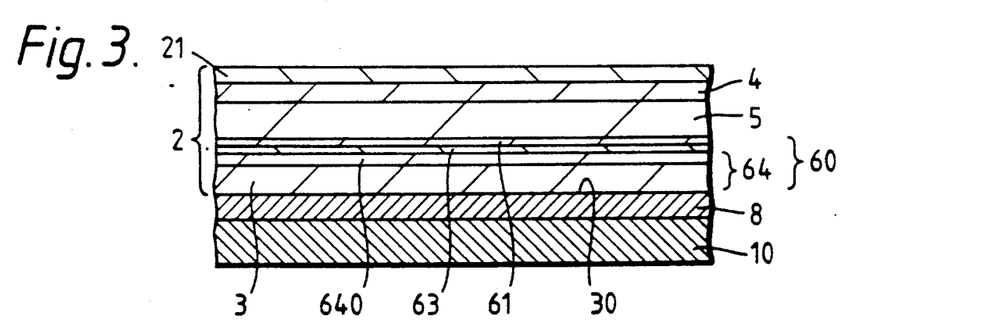

After the sacrificial support 10 has been provided to form the structure shown in FIG. 2, the structure is inverted and the majority of the thickness of the gallium arsenide substrate is removed by a conventional mechanical technique such as lapping. The remaining about 100 μm thickness of the substrate 20 is then selectively removed by conventional chemical etching techniques until the aluminium gallium arsenide sacrificial layer 21 which acts as an etch-stop layer exposed as shown in FIG. 3.

Figure 4:
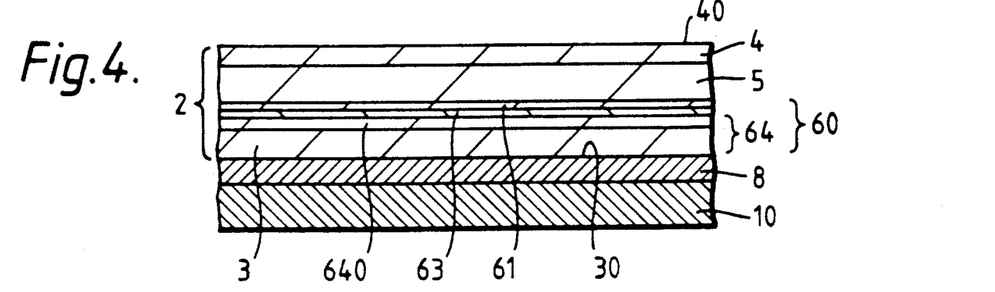

The sacrificial aluminium gallium arsenide layer 21 is then selectively removed with respect to the gallium arsenide anode contact region 4 by etching with, for example, concentrated hydrofluoric acid so as to expose the surface 40 of the anode contact region 4 as illustrated in FIG. 4.

An ohmic contact layer 9, for example of similar composition to the cathode layer 8 is then deposited on the exposed surface 40 using, for example, conventional sputtering techniques.

Figure 5:
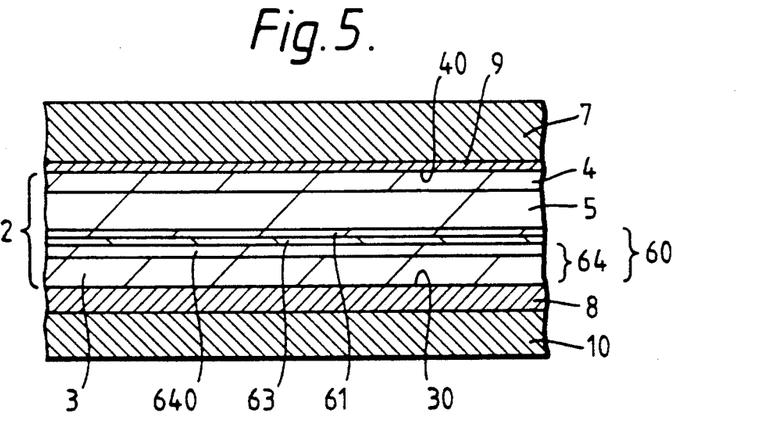

The heat sink region 7 is then provided on the anode ohmic contact layer 9 as, in this example, a thick, for example 50 μm, layer of gold deposited using conventional plating techniques to produce the structure shown in FIG. 5.

Figure 6:
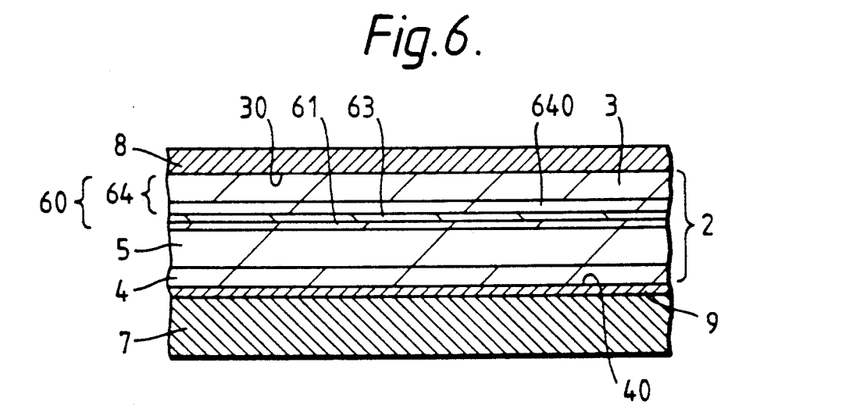

After the heat sink region 7 has been provided, the structure is inverted and the sacrificial support 10 is selectively removed to expose the cathode ohmic contact layer 8 as shown in FIG. 6.

Figure 7:
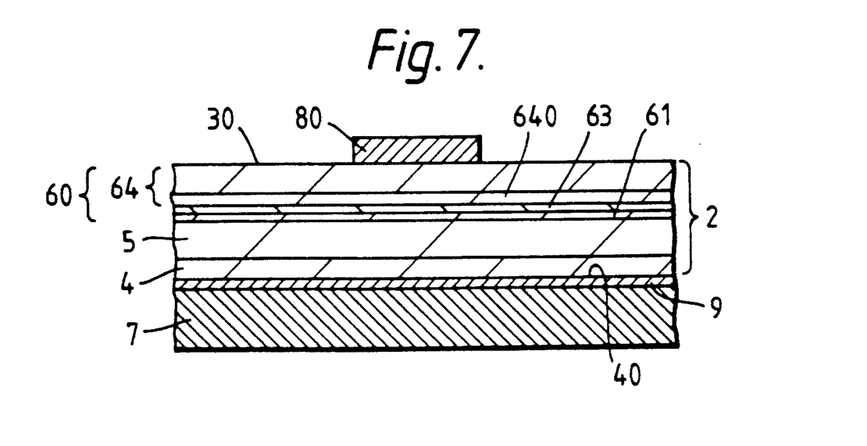
Figure 8:
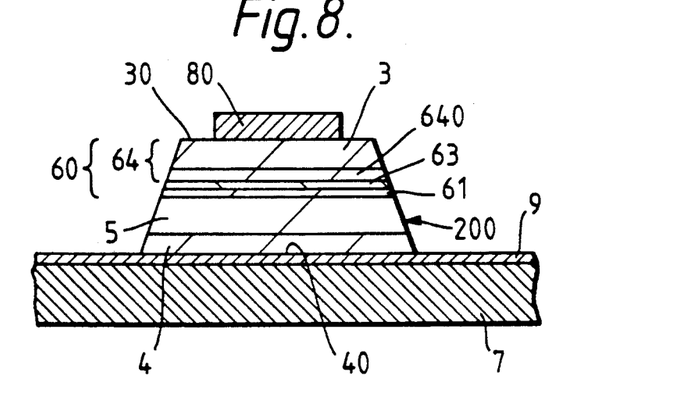

Using conventional photolithographic and etching techniques, the cathode ohmic contact layer 8 is patterned to define individual contacts 80 for the separate transferred electron effect devices to be formed from the epitaxial layer structure. The formation of only one of these devices is illustrated in FIGS. 7 to 9 although it will be appreciated that many such devices will be formed from the epitaxial layer structure 2.

After formation of the ohmic contact region 80, a further photolithographic mask is defined and conventional etching techniques are used to define the separate mesas of the individual devices from the epitaxial structure. One such mesa 200 is shown in FIG. 8. The heat sink regions 7 is then separated by conventional photolithographic and etching techniques to define individual heat sinks 70 for the separate devices I as illustrated in FIG. 9.

Figure 10:
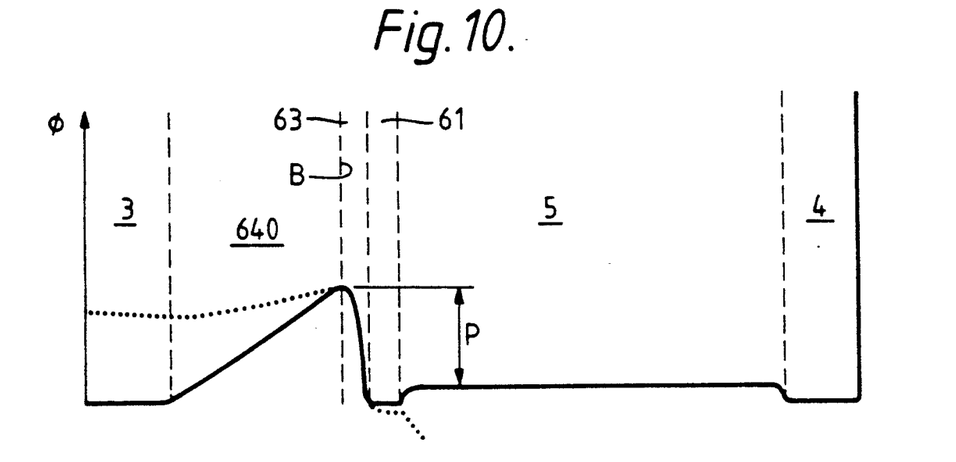
FIG. 10 is a potential diagram for the transferred electron effect device shown in FIG. 9.

FIG. 10 is a potential diagram for the transferred electron effect or Gunn device shown in FIG. 9 and the solid line illustrates the change in potential energy of the conduction band across the various regions of the transferred electron effect device under zero bias with the various regions being referenced by the same reference numerals used in FIG. 9 and being shown separated by vertical dashed lines in FIG. 10.

The barrier-defining region 63 of the injection zone 60 is sufficiently thin so as to be fully depleted of free charge carriers under zero bias (and therefore also in operation of the device) because of the merging of the depletion layers formed at the junctions with the first and second regions 61 and 63. The barrier-defining region 63 thus defines a potential barrier P to the flow of electrons between the first and second regions 61 and 63. As commonly understood in the semiconductor art, a semiconductor region (such as the region 63) is said to be substantially depleted of charge carriers of both conductivity types when the number of mobile charge carriers of both conductivity types is negligible (usually for example at least two orders of magnitude less) compared with that of the net impurity concentration in said region. The presence of the negative space-charge region introduces band bending and, as shown in FIG. 10, thus defines the potential barrier P to the flow of electrons between the first and second regions 61 and 64. The first and second regions 61 and 64 and the barrier-defining region 63 thus form a camel diode of the type described in GB-A-1573309 and GB-A-1573310 and in the aforementioned paper by J. M. Shannon.

As can be seen from FIG. 10 because of the fact that the first subsidiary region 640 of the second region 64 is more lowly doped than the first region 61, the potential barrier P is asymmetric with the maximum of the potential barrier lying close to the boundary B between the first subsidiary region 640 and the barrier-defining region 63.

The thickness and dopant concentration of the barrier-defining region 63 are selected so that the potential barrier P defined by the barrier-region region 63 has a peak height in electron volts (eV) comparable with the difference in electron volts between the main (Γ) and satellite (L) conduction band minima of the material forming the active region 5. In this example where the active region 5 is formed of gallium arsenide, then the lower or conduction band main minimum (Γ) at k=0 lies 0.31 eV (electron volts) below the conduction band satellite minima (L) which are located along the <111> axes and the doping and thickness of the barrier-defining region 63 as given above are selected so that the potential barrier has a peak height of about 0.4 eV.

In use of the transferred electron effect device shown in FIG. 9, a potential difference is applied between the cathode and anode contact regions 3 and 4 via the ohmic contact electrodes 8 and 9 so as to maintain in the active region 5 an electric field in excess of the threshold or critical field which for gallium arsenide is typically 3.5 KV/cm (kilo volts per centimeter) and so as to enable electrons to be emitted from the injection zone 60 into the active region 5, that is with the cathode negatively biased with respect to the anode. As mentioned above, and as shown in FIG. 10, the potential barrier is asymmetric because of the difference in dopant concentration between the first region 61 and the first subsidiary region 640. Thus, with the electric field applied as indicated above so that the relatively lowly doped first subsidiary region 640 is negatively biased with respect to the more highly doped first region 61, the camel diode formed by the injection zone 60 is in effect forward-biased and the energy of the electron distribution in the relatively lowly doped first subsidiary region 640 is thus raised facilitating flow of electrons over the potential barrier P. The potential change across the injection zone is illustrated schematically by the dotted line in FIG. 10. As will be appreciated, when the field across the active region 5 exceeds the threshold or critical field, the potential drop across the active region 5 will be very large. Therefore, in the interests of conciseness, the dotted line has been terminated just inside the active region 5.

Electrons with an energy in electron volts comparable to that of the potential barrier P and therefore to that of the conduction band satellite minima (L) are thus emitted into the active region 5, the first region 61 being sufficiently thin to prevent appreciable thermalisation of the hot electrons before the hot electons reach the active region 5. Thus, electrons which are sufficiently hot, that is have sufficient energy, to transfer into the conduction band satellite minima (L) of the relatively high field active region 5 and so enable the active region to exhibit a negative differential resistance are emitted directly into the active region 5 without the need for part of the relatively high field active region to act as an acceleration or dead zone. As indicated above, the first region 61 should be sufficiently thin to prevent appreciable thermalisation of the hot electrons. A typical thermalisation time for a III-V semiconductor material such as gallium arsenide is given in a paper by B. K. Ridley entitled 'Anatomy of the Transferred Electron Effect in 3-5 Semiconductors' published in the Journal of Applied Physics, Volume 48 No. 2, February 1977 at pages 754 to 764, 1977 as:

$$\frac{1}{\tau_{\epsilon eff}} = \frac{1}{\tau_\epsilon} \frac{n_\Gamma}{n_\Gamma + n_\Gamma}$$

where $\tau_{68}$ is the thermalisation time for electrons in the main conduction band minimum ($\Gamma$), typically 0.03 picoseconds for gallium arsenide and $n_\Gamma$ and $n_L$ are, respectively, the electron concentrations in the $\Gamma$ and L minima. As the distribution of the emitted electrons between the main and satellite conduction band minima $\Gamma$ and L is not accurately known, it is assumed here that the ratio $n_\Gamma:n_L$ is given by the ratio of the density of states $d_\Gamma$ and $d_L$ in the main and satellite conduction band minima $\Gamma$ and L leading to an enhanced thermalisation time $\tau_{\epsilon eff}$ of about 3 picoseconds. Assuming a diffusion coefficient $\mu KT/q$ where K is Boltzmann's constant, T the average electron temperature, q the quantity of charge and $\mu$ the mean mobility, then for a heavily n conductivity doped first region 61 of gallium arsenide with a mean mobility $\mu=0.2m2/Vs$, a thermalisation length of 120 nanometers can be deduced. Accordingly, the first region 61 should be thinner than 120 nanometers (and indeed in the example given above the first region 61 is only 10 nanometers thick), but should be thick enough to avoid penetration of the depletion region into the active region 5.

With the transferred electron device placed in an appropriate microwave cavity as is conventional in the art, then microwave oscillations can be extracted from the device. As is known in the art, the fundamental frequency of the oscillation is approximately equal to the reciprocal of the carrier transit time across the active region, that is the frequency of the output is related to the time taken for an accumulation or dipole layer to traverse the active region 5, and for the dimensions given above, then the device should have a fundamental oscillation frequency in the region of 47 GigaHertz (GHz).

Transferred electron effect or Gunn devices similar to that shown in FIG. 1 and described above have been fabricated which, when a microwave output is extracted, using conventional techniques, at the second harmonic of the fundamental oscillator frequency, provide significantly higher power and at greater efficiency than comparable transferred electron effect devices with cathode heat sinks. Thus, transferred electron effect devices of a structure similar to that shown in FIG. 9 having an anode heat sink and operating in second harmonic mode at 94 GHz (Gigahertz) have shown a two-fold increase in (that is a doubling of) rf output power compared to devices of similar epitaxial structure having cathode end heat sinks.

Thus, the present inventors have found that, surprisingly, despite the high electric field induced at the cathode end of the device by the introduction of the injection zone 60, the placing of the heat sink region 7 adjacent the anode contact region 3 rather than adjacent the cathode contact region 4 enables significant improvements in rf output power. It is believed that the provision of the heat sink region 7 adjacent the anode contact region 4 results in such significant improvements because the injection zone 60 acts to eliminate or at least substantially reduce the dead 'acceleration' zone which is present in a conventional ohmic contact Gunn diode. Because the injection zone 60 is effective in removing or at least reducing the energy-dissipating dead zone, the energy or heat dissipation within the transferred electron effect device is weighted even more strongly towards the anode end of the device than in a conventional ohmic contact device so that even greater improvements in rf output power and efficiency can be achieved by placing the heat sink region 7 adjacent the anode contact region 4.

The method described above for manufacturing the transferred electron effect device enables the heat sink region 7 to be provided on the surface 40 of the anode contact region 4 exposed after removal of the substrate 20. This allows the heat sink region 7 to be in thermal contact with the anode contact region 4 enabling the above-described increased performance whilst allowing the epitaxial layer structure 2 to be grown in the same order as for a similar device having a cathode end heat sink region.

Accordingly, the active region 5 can be grown, as described above, before the injection zone 60 so that the injection zone 60 does not have to suffer the prolonged high temperature environment which would have existed if the active region 5 were grown after the injection zone. The exposure of the injection zone 60 to such a high temperature environment would have led to increased diffusion and interface degradation. Using the method described above, however, unwanted diffusion is reduced and the desired sharp or abrupt interfaces can be obtained.

In addition, the transferred electron effect device described above may enable a reduction in FM noise because the position within the device at which nucleation of dipole or accumulation layers occurs and so the frequency of the output pulses caused by the propagation of these charge layers should be more precisely determined or reproducible.

The height of the barrier provided by the forward-biased camel diode injection zone 60 shown in FIG. 9 is relatively insensitive to bias. Moreover, the forward-biased camel diode injection zone should have an ideality factor close to one so that the potential which needs to be applied to achieve a desired threshold field in the active region 5, and thus the dc power which needs to be input to the device to achieve good efficiency, should be lower than would be required, for example, with the device described in U.S. Pat. No. 4,539,581 where the injection zone is in the form of a planar doped barrier diode which has a much higher ideality factor than a camel diode and so should require a much higher dc power input to achieve an equivalent threshold field in the active region 5.

Figure 11:
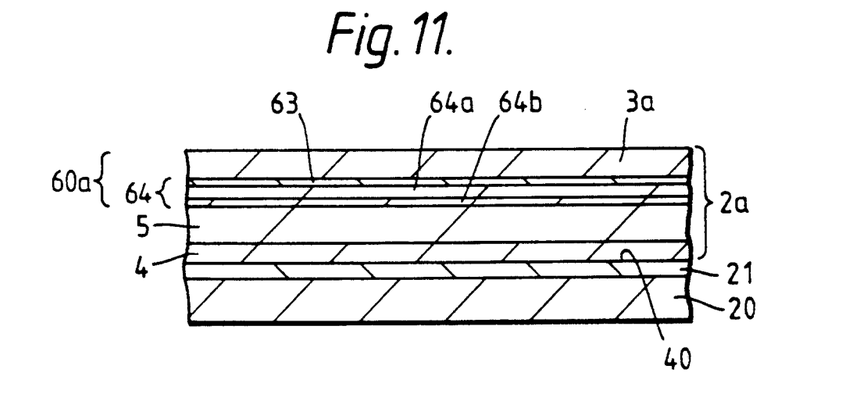
FIG. 11 is a cross-sectional view, similar to FIG. 1, of a different epitaxial layer structure, grown on a substrate, for use in manufacturing another transferred electron effect device in accordance with the invention.

FIG. 11 illustrates schematically the epitaxial layer structure 2a, carried on a substrate 20, for forming a different transferred electron effect device in accordance with the invention.

In the epitaxial structure shown in FIG. 11, the second region 64 adjoins the active region 5 and comprises first and second subsidiary regions 64a, 64b with the second subsidiary region 64b being spaced from the barrier-defining region 63 by the first subsidiary region 64a and being more highly doped than the first subsidiary region 64a. In this example, the first region which again is relatively highly doped also serves as the cathode contact region 3a.

The epitaxial layer structure 2a shown in FIG. 11 may be manufactured using the same techniques as those described above with reference to FIG. 1 and comparable epitaxial layers may have similar thicknesses and dopant concentrations. In so far as the epitaxial structure shown in FIG. 11 differs from that shown in FIG. 1, in that the second region 64 is provided on top of the active region 5 as an n conductivity type gallium arsenide epitaxial layer so that the first relatively lowly doped subsidiary region 64a is spaced from the active region 5 by the second relatively highly doped subsidiary region 64b, the first subsidiary region 64a may have a dopant concentration of $1.0 \times 10^{16}$ atoms cm$^{-3}$ and a thickness of 0.1 micrometers whilst the second subsidiary region 64b may have a dopant concentration of $5 \times 10^{-}$atoms Cm$^{-3}$ and a thickness of 10 nm.

The first subsidiary region 64a is followed by the barrier-defining region 63 which is provided, as in the epitaxial layer structure shown in FIG. 1, as a p-conductivity type gallium arsenide epitaxial layer with a thickness of about 16 nm and a dopant concentration of about $3.5 \times 10^{18}$ atoms cm$^{-3}$. The barrier-defining region 63 is followed by the first region which also forms the cathode contact region 3a and, in this example, is formed as a highly doped n-conductivity type gallium arsenide epitaxial layer with a thickness of about 1.5 micrometers and a dopant concentration of about $5 \times 10^{18}$ atoms Cm$^{-3}$.

The method described above with reference to FIGS. 2 to 8 is used to define the transferred electron effect device shown in FIG. 12 because as will be appreciated by those skilled in the art, the transferred electron effect device shown in FIG. 12 differs only by way of the structure of the injection zone 60a.

Figure 13:
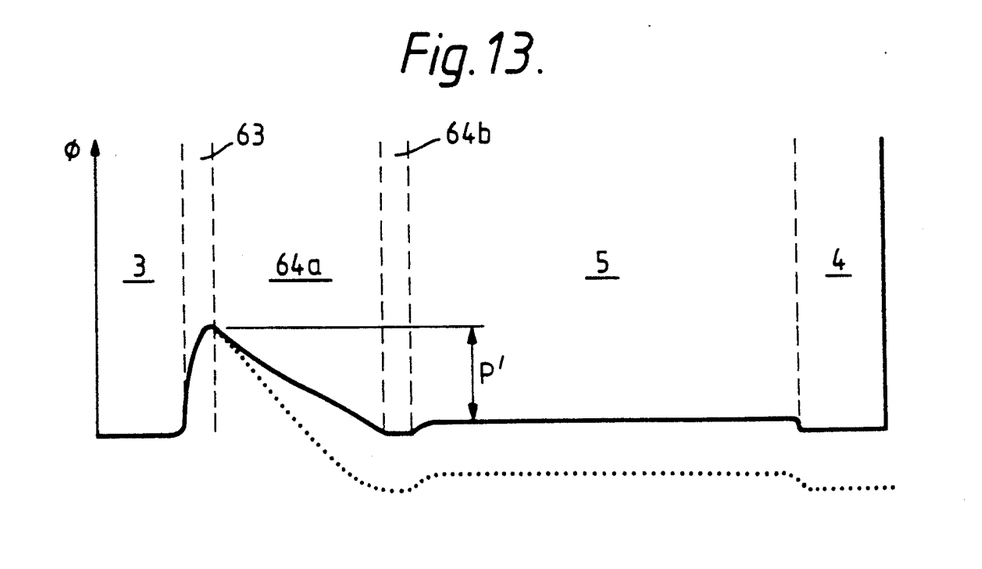
FIG. 13 is a potential diagram for the transfer electron effect device shown in FIG. 12.

FIG. 13 is a potential diagram of the conduction band edge similar to FIG. 10 but for the device structure shown in FIG. 12 indicating in solid lines the potential changes across the device under zero bias.

As will be appreciated from a comparison of FIGS. 12 and 13 with FIGS. 9 and 10, the barrier-defining region 6 and first and second regions 3 and 64 again from a camel diode but the camel diode of FIG. 3 is in effect reversed compared to that of the device structure shown in FIG. 9. That is, in the mesa structure 200a of the device structure shown in FIG. 12, the more lowly doped first subsidiary region 64a is placed on the anode contact region 4 side of the barrier-defining region 63 whilst in the device structure shown in FIG. 9 the more lowly doped first subsidiary region 64a is placed on the cathode contact region 3 side of the barrier-defining region 63. Accordingly, when an electric field is applied across the cathode and anode contact regions 3 and 4 so as to enable electrons to be emitted from the injection zone 60a into the active region 5, the camel diode shown in FIG. 12 is effectively reverse-biased, that is the boundary between the barrier-defining region 63 and the relatively lowly doped first subsidiary region 64a is reverse- biased.

The effect of the reverse-biasing of the camel diode shown in FIG. 12 is indicated schematically in FIG. 13 for a reverse-bias which is sufficiently low that the field across the active region 5 is negligible. In practice, when a potential is applied across the cathode and anode contact regions via the electrodes 80 and 9 which is sufficient to provide a field greater than the threshold field in the active region 5, the potential barrier P' is pulled down to some extent by the reverse-biasing. As a result there are more electrons which are sufficiently hot to pass over the potential barrier P' and therefore the current passing over the potential barrier P' under the reverse-biasing of the camel diode will be increased because, as indicated above, the reverse-biasing in operation of the device lowers the potential barrier P' and therefore the current passing over the potential barrier P' under the reverse-biasing of the camel diode will be increased because, as indicated above, the reverse-biasing in operation of the device lowers the potential barrier P'.

In operation of the device shown in FIG. 12, the potential barrier P' serves to ensure that the relatively lowly doped first subsidiary region 64a acts as a short relatively high field region which causes the electrons which have passed over the potential barrier P' and will therefore already be somewhat hotter than the cathode, to be accelerated and thus further heated so that again electrons are emitted from the injection zone 60a into the active region 5 with an energy comparable to that of the conduction band satellite minima L so enabling the active region 2 to exhibit a negative differential resistance characteristic and enabling, as in the device shown in FIG. 9, nucleation of instabilities and growth of accumulation and dipole layers resulting in an oscillatory output which, when the device is placed in the appropriate microwave cavity as is conventional in the art, can generate a microwave output.

Again, for reasons similar to those described above in relation to FIGS. 9 and 10, the provision of the heat sink region 7 at the anode contact region 4 end of the device results in significant increases in rf output power. Also, the method of manufacturing the device has the advantages described above of enabling the epitaxial structure to be grown in the conventional order so avoiding having to subject the injection zone 60a to undesirable prolonged high temperature processing.

Although in the device structure shown in FIG. 9, the first region 61 is intended to be sufficiently highly doped and thick (whilst not being sufficiently thick to allow thermalisation of the hot electrons before entry into the active region 5) to prevent the depletion region of the pn junction between the barrier-defining region 63 and the first region 61 extending into the active region 5, this need not necessarily be the case. Indeed, the first region 61 may be made sufficiently thin that at certain applied bias potentials the depletion region may extend into the active region 5. As will be appreciated, in contrast to the arrangement described above with reference to FIG. 9, this would have the effect of making the height of the potential barrier defined by the barrier-defining region 63 very bias dependent so that the energy of the electrons passing over the potential barrier would also be very bias dependent. Such a device could be tuned to provide a feedback effect with the microwave output of the device which in practice impresses an AC component on the dc potential bias applied across the device in effect adjusting the height of the potential barrier. In this case, the barrier-defining region 63 should be such that, during the positive half cycle of the AC component, the height of the potential barrier provided by the barrier-defining region 63 is such that electrons emitted over the potential barrier into the active region 5 have an energy equal to or greater than that of the satellite conduction band minima whilst during the negative half cycle of the AC component the potential barrier is lowered so that electrons are emitted over the potential barrier into the active region 5 with an energy less than that of the satellite conduction band minima. During the positive half cycle electrons in the active region 5 are scattered from the main conduction band minimum ($\Gamma$) to the satellite conduction band minima (L) whilst during the negative half cycle electrons tend to scatter from the satellite conduction band minima (L) to the main conduction band minimum ($\Gamma$). In this example, the injection zone 60 enables the electrons emitted or injected into the active region 5 to be in the appropriate conduction band minimum or minima for operation of the transferred electron effect device whereas, with the arrangements described above with reference to FIGS. 9 and 12, electrons with sufficient energy to surmount the potential barrier P have an energy comparable to that of the conduction band satellite minima (L) of the active region 5 regardless of whether the electrons are emitted into the active region during the positive or the negative half cycle of the AC component.

As will be appreciated from the above, the height of the potential barrier P provided by the barrier-defining region 63 may be adjusted as desired so that electrons passing over the barrier have the desired energies. The barrier height may be adjusted over a wide range by selecting the doping and/or thickness of the barrier-defining region 63 appropriately. In addition to selection of the doping and/or thickness of the barrier-defining region 63, an additional Knudsen source providing aluminium atoms may be used during the molecular beam epitaxial growth of the barrier region so that the barrier-defining region 63 is formed of an $Al_xGa_{1-x}As$ alloy so providing a band gap discontinuity (as determined by the percentage of aluminium) or heterojunction in addition to the potential barrier provided by the doping. The use of such a heterojunction may enable the proportion of the potential barrier provided by the barrier-defining region 63 to be reduced down to about 0.1 electron volts so reducing the corresponding potential well for holes in the valence band and thus reducing hole trapping and storage problems.

Although the potential diagrams of FIGS. 10 and 13 indicate that the active region 5 has a uniform doping across its thickness, the dopant concentration may be graded across the active region 5 to compensate for the resistance p variation induced across the device by the mobility $\mu m$ gradient caused by the temperature gradient developed in use across the device because $p=(q\mu n\ n)^{-1}$, with the carrier concentration n being essentially constant up to about 250° C., and the mobility $\mu n$ is conversely proportional to temperature. The method of the present invention has a particular advantage in these circumstances in that it allows the doping concentration to be increased during growth of the active region so as to produce the desired graded profile and most epitaxial growth machine such as MBE machines produced better, more abrupt, interfaces when the dopant concentration is increased, rather than decreased, during growth.

As indicated by FIGS. 10 and 13, in the device structures of FIGS. 9 and 12, the first subsidiary region 640 or 64a is more lightly doped than the first region 61,3. However, taking, for example, the structure indicated by the potential diagram of FIG. 13, the first subsidiary region 64a may be omitted so as to provide an injector zone 60 in which the barrier-defining region 63 is bounded on either side by a relatively highly doped n conductivity type region. Such a structure would have a strongly bias-dependent barrier so that the energy of emission of electrons over the barrier increases with bias allowing further improvements in efficiency by enabling electrons with sufficient energy to transfer into the satellite minima (L) to be emitted over the barrier only during that part of the cycle of the induced rf bias during which a domain of negative resistance is formed.

The present invention may, however, be applied to transferred electron effect devices having other forms of injection zones for emitting hot electrons with an energy comparable to that of the conduction band satellite minimum (L) of the active region 5 into the active region 5. Thus, for example the transferred electron effect device may have a planar doped barrier diode injection zone as described in U.S. Pat. No. 4,539,581 or a graded band-gap heterojunction injection zone as described in GB-A-2196473.

Although the devices described above comprise a gallium arsenide semiconductor body, a transferred electron effect device in accordance with the invention may be manufactured with the active regions 5 formed from any of the semiconductor materials in which the transferred electron effect has been observed, for example indium phosphide or any of the other materials mentioned, for example, on page 648 of the 1981 edition of the text book entitled 'Physics of Semiconductor Devices' second edition by S. M. Sze with the height of the barrier provided by the barrier-defining region 63 being appropriately tailored for the material concerned so as to be comparable in energy with the separation between the main conduction band and at least one conduction band satellite minimum of the material. Also, the injection zone 60 need not necessarily be formed of a material which exhibits a transferred electron effect but could be provided by another semiconductor material (or combination of semiconductor materials if the barrier-defining region 63 is to define heterojunctions with the bounding first and second regions) which provides a suitable lattice match. Thus, for example, where the active region 5 is formed of gallium arsenide, aluminium arsenide could be used in the injection zone 60.

From reading the present disclosure, other modifications will be apparent to persons skilled in the semiconductor art for example persons skilled in the design, manufacture and/or use of semiconductor devices. Although claims have been formulated in this application to particular combinations of features, it should be understood that the scope of the disclosure of the present application also includes any novel feature or novel combination of features disclosed herein either explicitly or implicitly or any generalisation or modification of that feature or of one or more of those features whether or not it relates to the same invention as presently claimed in any claim. The applicants hereby give notice that new claims to such features and/or combinations of such features may be formulated during the prosecution of the present application or of any further application derived therefrom.

We claim:

1. A transferred electron effect device comprising a semiconductor body having cathode and anode contact regions, an active region of n conductivity type disposed between the contact regions and formed of a semiconductor material having a relatively low mass, high mobility conduction band main minimum and at least one relatively high mass, low mobility conduction band satellite minimum, and an injection zone adjoining the active region and defining a potential barrier between the cathode contact region and the active region for causing electrons to be emitted, under the influence of an electric field applied between the cathode and anode contact regions, from the injection zone into the active region with an energy comparable to that of a relatively high mass, low mobility conduction band satellite minimum of the active region, characterized in that the device is provided with a heat sink region and the anode contact region but not the cathode contact region is in thermal contact with said heat sink region for removing heat dissipated within the semiconductor body, said cathode contact region being free of any heat sink.

2. A device according to claim 1, wherein the active region and the injection zone are formed by an epitaxial layer structure from which the monocrystalline substrate on which the active region and the injection zone were sequentially grown has been selectively removed to expose a surface of the epitaxial layer structure, and wherein the heat sink region contacts the exposed surface of the epitaxial layer structure.

3. A device according to claim 1, wherein the injection zone comprises first and second n conductivity type regions separated by a barrier-defining region which has an impurity concentration characteristic of the p conductivity type and which is sufficiently thin so as to be fully depleted of free charge carriers under zero bias, at least one of the first and second regions being highly doped relative to the active region at least adjacent the barrier-defining region and the barrier-defining region having an impurity concentration such that, in operation of the device, electrons with sufficient energy to surmount the potential barrier provided by the barrier-defining region are emitted into the active region with an energy comparable to that of a conduction band satellite minimum of the active region.

4. A device according to claim 3, wherein, at least adjacent the barrier-defining region, the first region is more highly doped than the second and active regions.

5. A device according to claim 3, wherein the second region comprises first and second subsidiary regions and the second subsidiary region is spaced from the barrier-defining region and is more highly doped than the active region and the first subsidiary region.

6. A device according to claim 3, wherein the first region adjoins the active region.

* * * * *